US010686020B2

(12) United States Patent
Lobo et al.

(10) Patent No.: US 10,686,020 B2
(45) Date of Patent: Jun. 16, 2020

(54) PEROVSKITE ILLUMINATED VEHICLE CONTROL SURFACES

(71) Applicant: Ford Global Technologies, LLC, Dearborn, MI (US)

(72) Inventors: Harry Lobo, Canton, MI (US); Paul Kenneth Dellock, Northville, MI (US); Ulrich Stuhec, Ann Arbor, MI (US); David Brian Glickman, Southfield, MI (US); Stuart C. Salter, White Lake, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/193,758

(22) Filed: Nov. 16, 2018

(65) Prior Publication Data

US 2020/0161379 A1    May 21, 2020

(51) Int. Cl.
| | |
|---|---|
| *G06F 3/041* | (2006.01) |
| *H01L 27/32* | (2006.01) |
| *B60Q 3/20* | (2017.01) |
| *H01L 51/00* | (2006.01) |
| *H01L 51/50* | (2006.01) |
| *B60H 1/00* | (2006.01) |
| *B60K 37/06* | (2006.01) |

(52) U.S. Cl.
CPC .............. *H01L 27/323* (2013.01); *B60Q 3/20* (2017.02); *G06F 3/041* (2013.01); *H01L 51/0097* (2013.01); *H01L 51/5032* (2013.01); *B60H 1/0065* (2013.01); *B60K 37/06* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 9,958,594 B2 | 5/2018 | Zeng | |
| 9,971,085 B2 | 5/2018 | Seo et al. | |
| 2015/0293629 A1* | 10/2015 | Ryu | ................. G06F 3/044 345/174 |
| 2018/0001816 A1 | 1/2018 | Dellock et al. | |
| 2018/0107070 A1* | 4/2018 | Rao | .................. G02B 6/0023 |
| 2018/0150201 A1* | 5/2018 | Kakinuma | ........... G06F 3/04883 |
| 2019/0259961 A1* | 8/2019 | Congreve | ........... H01L 51/0077 |

FOREIGN PATENT DOCUMENTS

| | | |
|---|---|---|
| CN | 206805067 U | 12/2017 |
| GB | 2547440 A | 8/2017 |

* cited by examiner

*Primary Examiner* — Joseph R Haley
(74) *Attorney, Agent, or Firm* — Frank Lollo; Eversheds Sutherland (US) LLP

(57) ABSTRACT

Vehicle and touch pad are disclosed including perovskite features for illumination. An example vehicle includes a touch pad having a substrate, circuit elements disposed on the substrate, pairs of electrodes disposed on the substrate, and perovskite ink disposed on the substrate between each respective pair of electrodes, wherein the perovskite ink is configured to provide illumination of the circuit elements by passing current through the pairs of electrodes.

17 Claims, 3 Drawing Sheets

PEROVSKITE ILLUMINATED VEHICLE CONTROL SURFACES

TECHNICAL FIELD

The present disclosure generally relates to vehicle control surfaces and, more specifically, illumination of vehicle control surfaces using perovskite ink.

BACKGROUND

Vehicles include many features which may be controlled by a user via buttons or other user interface elements. These vehicles may operate in varying conditions, and as such may be required to illuminate various buttons, features, elements, and other components of the vehicle. Various control surfaces of the vehicle may be positioned such that they extend around curves, are flexible, or otherwise require specialized circuitry.

Perovskite materials are structured compounds that can absorb and emit light under certain circumstances.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

A vehicle is disclosed having a touch pad configured to perform various functions and operating according to the requirements disclosed herein. The vehicle includes a touch pad having a substrate, circuit elements disposed on the substrate, pairs of electrodes disposed on the substrate, and perovskite ink disposed on the substrate between each respective pair of electrodes, wherein the perovskite ink is configured to provide illumination of the circuit elements by passing current through the pairs of electrodes.

Also disclosed is a touch pad comprising a substrate, circuit elements disposed on the substrate, pairs of electrodes disposed on the substrate, and perovskite ink features disposed on the substrate between and electrically coupled to respective pairs of electrodes, wherein the perovskite ink features are configured to provide illumination of the circuit elements by passing current through the pairs of electrodes.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
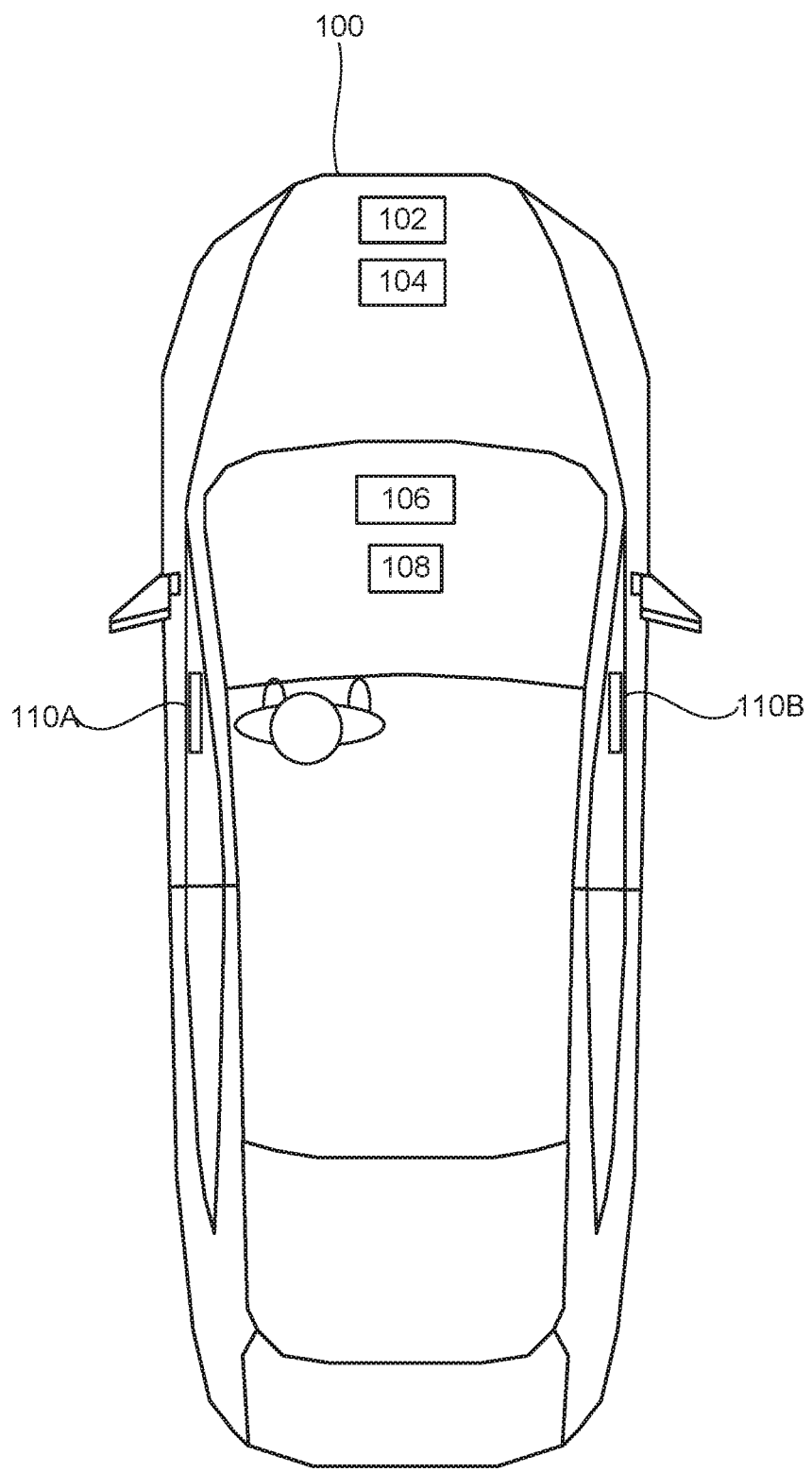
FIG. 1 illustrates a vehicle according to embodiments of the present disclosure.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

As noted above, vehicles may include many features which can be controlled by users of the vehicle via one or more buttons, touch pads, touch screens, knobs, wheels, and other input devices. Some of these input devices may include "smart surfaces" or panels that display information as well as receive input. These surfaces may be internal to the vehicle or external, such as on a door or frame of the vehicle.

In some examples, control surfaces may include printed electronic circuits, and may be over-molded with clear or translucent material. These surfaces may then be lit using one or a combination of light emitting diodes (LEDs), light bars, and/or light diffusers. However the inclusion of LEDs can increase cost, size and complexity of the control surface. Other solutions may have difficulty adapting to changes in temperature that often occur during the use of a vehicle, and/or may not have a wide enough working temperature range to provide sufficient lighting and operational characteristics.

With these issues in mind, embodiments of the present disclosure may provide a lighting mechanism that makes use of perovskites coupled to the control surface itself to illuminate the various options, selections, and information that might otherwise be lit by LEDs, light diffusers, and/or light bars.

As used herein, "touch pad" may refer to any surface, screen, or component that is configured to receive input from a user via a touch, swipe, tap, or other similar input. The input may be from a user's finger, pen, stylus, or other implement.

In some embodiments, and example vehicle touch pad may have a substrate, circuit elements disposed on the substrate, pairs of electrodes disposed on the substrate, and perovskite ink disposed on the substrate between each respective pair of electrodes, wherein the perovskite ink is configured to provide illumination of the circuit elements by passing current through the pairs of electrodes.

Perovskites are a class of materials having a specific crystalline structure called the perovskite structure. Perovskites may be cubic nanostructure semi-conductive crystals. A perovskite structured compound is most commonly a hybrid organic-inorganic lead or tin halide-based material that has a light-harvesting active layer. Perovskites may be more efficient at converting ultraviolet (UV) energy from UV light and converting it to visible light than LEDs, OLEDS or conventional quantum dots. As such, perovskites can have brighter light emissions under certain conditions.

Perovskites can be directly charged with electricity when the perovskites are suspended in a conductive clear ink and a current is passed through the ink. When charged, the perovskites convert the energy into light. Perovskites can be tuned to emit light in the visible range, and even tuned to emit a specific wavelength or range of wavelength, allowing for the emission of specific colors of light.

In some examples, the use of perovskite ink may include suspending perovskite material tuned to glow a specific color in a nano-silver translucent ink, and printing the ink over two silver ink electrodes. Other conductive inks such as Indium Tin Oxide (ITO) or graphene can also be used FIG. 1 illustrates an example vehicle 100 according to embodiments of the present disclosure. Vehicle 100 may be a standard gasoline powered vehicle, a hybrid vehicle, an electric vehicle, a fuel cell vehicle, or any other mobility implement type of vehicle. Vehicle 100 may be non-autonomous, semi-autonomous, or autonomous. Vehicle 100 may include parts related to mobility, such as a powertrain with an engine, a transmission, a suspension, a driveshaft, and/or wheels, etc. In the illustrated example, vehicle 100 may include one or more electronic components.

The battery 102 of vehicle 100 may be configured to provide power to one or more vehicles systems, as well as to the touch pads, perovskite ink, circuit elements, and/or other components described herein.

Processor 104 may control one or more vehicle systems in response to input received by the various touchpads and/or circuit elements of the touch pads. For example, touch pad 106 may include climate controls, and processor 104 may be configured to modify one or more climate control settings such as blower speed, temperature, etc., responsive to receiving input via touch pad 106.

Processor 104 may be any suitable processing device or set of processing devices such as, but not limited to, a microprocessor, a microcontroller-based platform, an integrated circuit, one or more field programmable gate arrays (FPGAs), and/or one or more application-specific integrated circuits (ASICs). There may also be a memory that includes volatile memory (e.g., RAM including non-volatile RAM, magnetic RAM, ferroelectric RAM, etc.), non-volatile memory (e.g., disk memory, FLASH memory, EPROMs, EEPROMs, memristor-based non-volatile solid-state memory, etc.), unalterable memory (e.g., EPROMs), read-only memory, and/or high-capacity storage devices (e.g., hard drives, solid state drives, etc.). In some examples, the memory includes multiple kinds of memory, particularly volatile memory and non-volatile memory. The memory may be computer readable media on which one or more sets of instructions, such as the software for operating one or more methods of the present disclosure, can be embedded. The instructions may embody one or more methods or logic as described herein. For example, the instructions reside completely, or at least partially, within any one or more of the memory, the computer readable medium, and/or within the processor 104 during execution of the instructions.

The terms "non-transitory computer-readable medium" and "computer-readable medium" include a single medium or multiple media, such as a centralized or distributed database, and/or associated caches and servers that store one or more sets of instructions. Further, the terms "non-transitory computer-readable medium" and "computer-readable medium" include any tangible medium that is capable of storing, encoding or carrying a set of instructions for execution by a processor or that cause a system to perform any one or more of the methods or operations disclosed herein. As used herein, the term "computer readable medium" is expressly defined to include any type of computer readable storage device and/or storage disk and to exclude propagating signals.

Vehicle 100 may also include a plurality of touch pads 106, 108, 110A and 110B. The touch pads may be positioned at various locations inside and/or outside of vehicle 100. For example, touch pad 106 may be a center console touch pad, providing specific vehicle controls to a user of the vehicle. Touch pad 108 may be an armrest control pad, allowing a user of vehicle 100 to control various aspects and functions of the vehicle. And touch pads 110A and 110B may be door mounted control touch pads.

Each touch pad may enable a user to provide input to control one or more vehicle functions, including climate control, entertainment, door locks and/or windows, mirror positions, and more.

Figure 2:
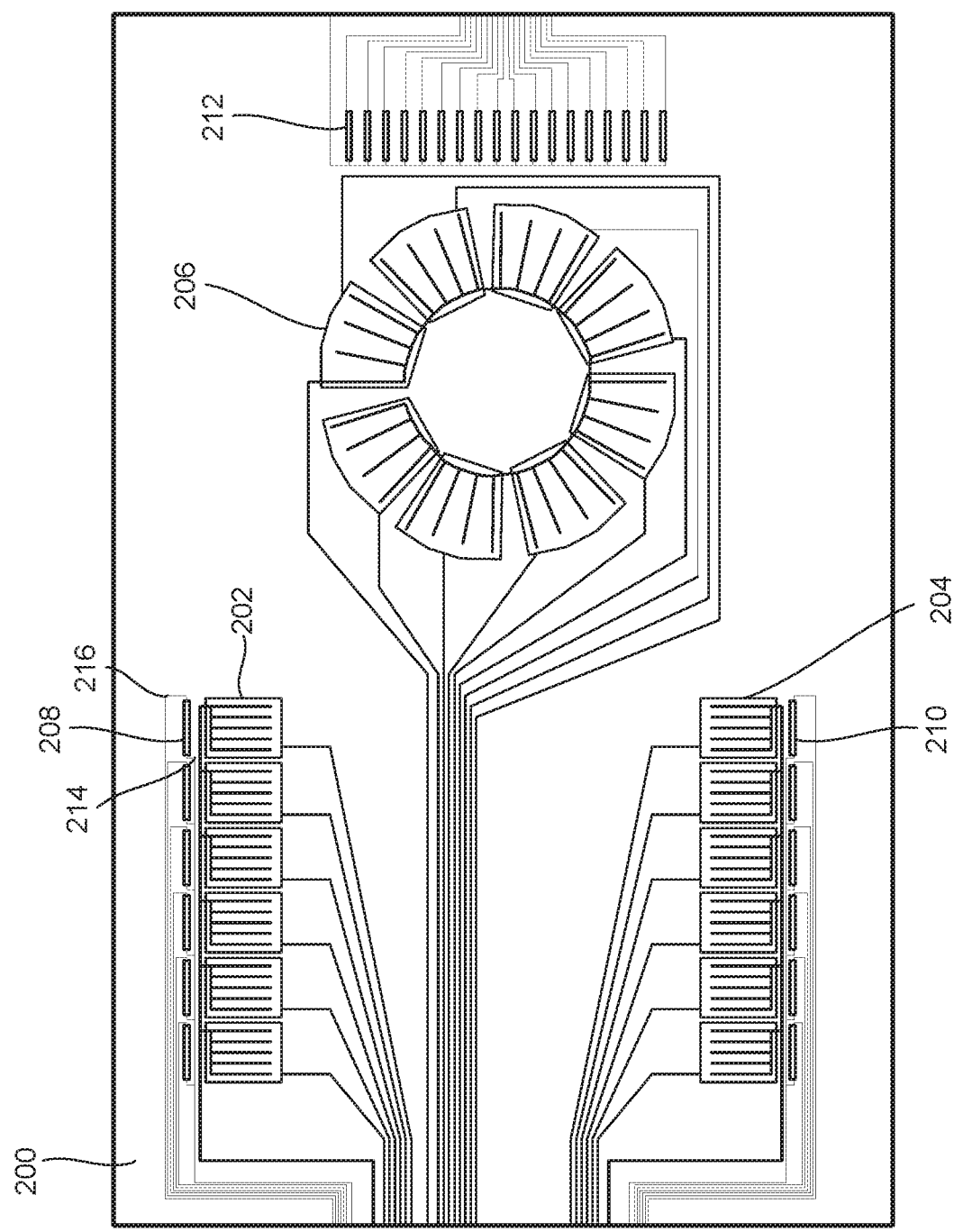
FIG. 2 illustrates an example touch pad according to embodiments of the present disclosure.

In some examples, one or more touch pads may be mounted outside vehicle 100 or on an exterior surface of vehicle 100, such as on door frame or proximate a door handle. This positioning may enable specific other features to be controlled, such as allowing a user to unlock or lock vehicle from outside the vehicle without a key. Other touch pads locations and positions are possible as well FIG. 2 illustrates an example substrate of embodiments of the present disclosure. The substrate 200 may be a film, such as a polyester film, polypropylene, acrylic, polyether ether ketone (PEEK), or another suitable backing material on which one or more printed circuit elements can be disposed.

Substrate 200 may be made into a flexible material. In certain examples, substrate 200 may be made from a material that prevents one or more circuit elements (such as diodes and/or LEDs) from being used. These features may require a hard circuit board that is not flexible.

In some examples, the substrate 200 may be formed to fit a contour of one or more specific feature of vehicle 100. This can include the console, armrest, door frame, and more.

Circuit elements such as circuit elements 202, 204, and 206 may be disposed on the substrate 200. Each circuit element may be formed or printed on substrate 200 using a conductive ink, such as printed silver ink, indium titanium oxide (ITO), graphene, or other printed circuit board materials.

The circuit elements disposed on the substrate 200 may include one or more transistors, resistors, capacitors, inductors, antennas, touch switches, or sensors (e.g., capacitive touch sensors or other types of touch sensors).

In some examples, one or more circuit elements disposed on the substrate may enable the touchpad and/or processor to receive input from a user, such as via one or more of the touch switches or sensors.

Example embodiments may also include perovskite ink disposed on the substrate. FIG. 2 includes perovskite ink features 208, 210, and 212. These perovskite ink features may be configured to illuminate the circuit elements, or other information that may be relevant to a user using the touch pad (e.g., volume level, temperature setting, blower speed, etc.). This information may correspond to the features of vehicle 100 that are controllable via the touch pad and various circuit elements.

The perovskite ink may be disposed on the substrate between respective pairs of electrodes, such that the perovskite ink is configured to provide illumination of the circuit elements by passing current through the pairs of electrodes. In some examples, the perovskite ink may be positioned side by side with input circuit elements, to enable illumination of the circuit elements without requiring additional depth of the touch pad to include LEDs or other such devices.

The substrate 200 may be plasma treated to enhance adhesion of the circuit elements and/or perovskite ink. The perovskite may be mixed with other suitable material in order to develop specific properties, such as emission color, current and/or voltage required to operate, operating temperature, flexibility, and various other characteristics.

FIG. 2 illustrates a pair of electrodes 214 and 216 that are positioned such that perovskite ink feature 208 is between them. When current is passed from electrode 214 to electrode 216, it will pass through the perovskite ink feature 208 and thereby cause the ink to illuminate.

Figure 3A:
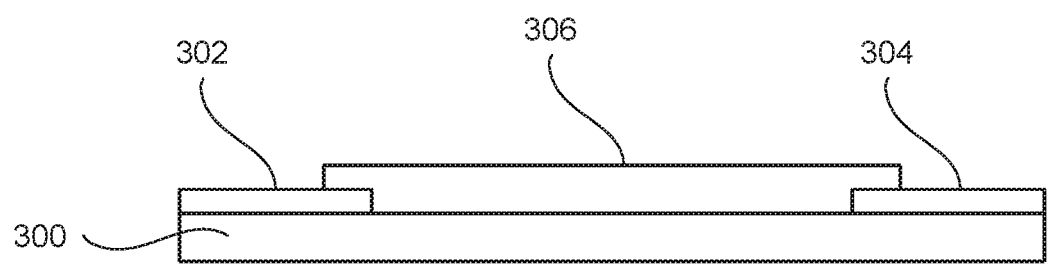
FIGS. 3A-3C illustrate example structures of the touch pad of FIG. 2, according to embodiments of the present disclosure.
Figure 3B:
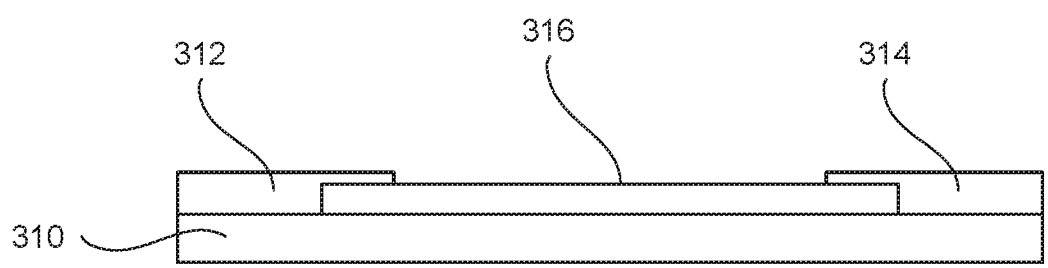
Figure 3C:
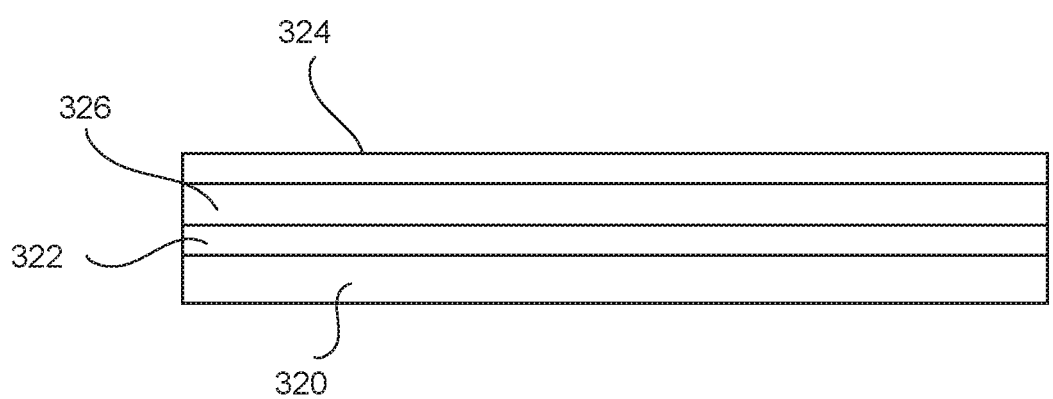

FIGS. 3A-3C illustrate three ways of positioning the electrodes with respect to the perovskite ink and substrate.

FIG. 3A illustrates that electrodes 302 and 304 may be positioned on the substrate 300. This can include screen printing the electrodes. A mask is then placed over the substrate 300 and parts of electrodes 302 and 304. The perovskite ink 306 is then printed onto the substrate and parts of electrodes 302 and 304 that are not covered by the mask. In this example, the pair of electrodes 302 and 304 are positioned on the substrate 300, and the perovskite ink 306 is positioned on both the pairs of electrodes and the substrate.

FIG. 3B illustrates a second arrangement, in which the perovskite ink 316 is positioned directly onto the substrate 310. The electrodes 312 and 314 are then positioned on top of the perovskite ink 316. In this example, the perovskite ink 316 is positioned entirely on the substrate, and the pair of electrodes 312 and 314 are positioned on both the substrate 310 and the perovskite ink 316.

FIG. 3C illustrates a third arrangement, wherein a first electrode 322 is position on the substrate 320. The perovskite ink 326 is positioned on the first electrode 322, and the second electrode 324 is positioned on the perovskite ink 326. The second electrode 324 may be printed from a clear or translucent ink, such as silver, graphene, or ITO. This allows the perovskite to shine through the second electrode 324.

Referring back to FIG. 2, there may further be a transparent layer positioned on top of the substrate 200, circuit elements 202, 204, and 206, and perovskite features 208, 210, and 212. The transparent layer may enable the emitted light from the perovskite features to illuminate the various circuit elements of the touch pad.

In some examples, one or more electrodes and perovskite ink features may be positioned in series with one or more of the circuit elements This can allow the amount of illumination, color, or some other characteristic of the perovskite feature to be directly affected by interaction with the circuit element. The perovskite features may also or alternatively be positioned in parallel with one or more circuit elements.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". As used here, the terms "module" and "unit" refer to hardware with circuitry to provide communication, control and/or monitoring capabilities, often in conjunction with sensors. "Modules" and "units" may also include firmware that executes on the circuitry. The terms "includes," "including," and "include" are inclusive and have the same scope as "comprises," "comprising," and "comprise" respectively.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A vehicle comprising:
   a touch pad having:
      a substrate;
      circuit elements disposed on the substrate;
      pairs of electrodes disposed on the substrate; and
      perovskite ink disposed on the substrate between each respective pair of electrodes, wherein the perovskite ink is configured to provide illumination of the circuit elements by passing current through the pairs of electrodes,
   wherein one or more of the pairs of electrodes are positioned in series with one or more of the circuit elements.

2. The vehicle of claim 1, wherein the touch pad comprises a center console.

3. The vehicle of claim 1, wherein the touch pad is configured to receive input from a user via the circuit elements.

4. The vehicle of claim 1, wherein the pairs of electrodes are positioned on the substrate, and the perovskite ink is positioned on both the pairs of electrodes and the substrate.

5. The vehicle of claim 1, wherein the perovskite ink is positioned entirely on the substrate, and the pairs of electrodes are positioned on both the substrate and the perovskite ink.

6. The vehicle of claim 1, wherein the pairs of electrodes each comprise a first electrode and a second electrode, and wherein:
   the first electrode is positioned on the substrate;
   the perovskite ink is positioned on both the substrate and the first electrode; and
   the second electrode is positioned at least partially on the perovskite ink.

7. The vehicle of claim 1, wherein the substrate comprises a flexible material, and wherein one or more of the circuit elements comprises a printed circuit element.

8. The vehicle of claim 1, wherein the touch pad further comprises a transparent layer positioned on top of the substrate, the circuit elements, and the perovskite ink.

9. A touch pad comprising:
   a substrate;
   circuit elements disposed on the substrate;
   pairs of electrodes disposed on the substrate; and
   perovskite ink features disposed on the substrate between and electrically coupled to respective pairs of electrodes, wherein the perovskite ink features are configured to provide illumination of the circuit elements by passing current through the pairs of electrodes,
   wherein the perovskite ink is configured to illuminate responsive to receiving input from a user via one or more of the circuit elements.

10. The touch pad of claim 9, wherein the touch pad comprises a center console of a vehicle.

11. The touch pad of claim 9, wherein the pairs of electrodes are positioned on the substrate, and the perovskite ink features are positioned on both the pairs of electrodes and the substrate.

12. The touch pad of claim 9, wherein the perovskite ink features are positioned entirely on the substrate, and the pairs of electrodes are positioned on both the substrate and the perovskite ink features.

13. The touch pad of claim 9, wherein the pairs of electrodes each comprise a first electrode and a second electrode, and wherein:
- the first electrode is positioned on the substrate;
- a first perovskite ink feature is positioned on both the substrate and the first electrode; and
- the second electrode is positioned at least partially on the first perovskite ink feature.

14. The touch pad of claim 9, wherein one or more of the pairs of electrodes are positioned in series with one or more of the circuit elements.

15. The touch pad of claim 9, wherein the substrate comprises a flexible material, and wherein one or more of the circuit elements comprises a printed circuit element.

16. The touch pad of claim 9, further comprising a transparent layer positioned on top of the substrate, the circuit elements, and the perovskite ink features.

17. A touch pad comprising:
- a substrate;
- circuit elements disposed on the substrate;
- pairs of electrodes disposed on the substrate; and
- perovskite ink features disposed on the substrate between and electrically coupled to respective pairs of electrodes, wherein the perovskite ink features are configured to provide illumination of the circuit elements by passing current through the pairs of electrodes,
- wherein one or more of the pairs of electrodes are positioned in series with one or more of the circuit elements.

\* \* \* \* \*